US008340616B2

(12) United States Patent
Shah et al.

(10) Patent No.: US 8,340,616 B2
(45) Date of Patent: Dec. 25, 2012

(54) TRACKING FILTER FOR TUNER

(75) Inventors: Peter Jivan Shah, San Diego, CA (US); YongSik Youn, San Diego, CA (US); Martin Christopher Alderton, San Diego, CA (US)

(73) Assignee: Entropic Communications, Inc., San Diego, CA (US)

( * ) Notice: Subject to any disclaimer, the term of this patent is extended or adjusted under 35 U.S.C. 154(b) by 1164 days.

(21) Appl. No.: 11/302,876

(22) Filed: Dec. 14, 2005

(65) Prior Publication Data

US 2006/0154636 A1 Jul. 13, 2006

Related U.S. Application Data

(60) Provisional application No. 60/636,556, filed on Dec. 16, 2004.

(51) Int. Cl.
*H04B 1/10* (2006.01)

(52) U.S. Cl. ............ 455/286; 455/306; 333/172

(58) Field of Classification Search ........... 455/285, 455/286, 302, 307, 290, 150.1, 306; 333/172, 333/174, 179; 375/350
See application file for complete search history.

(56) References Cited

U.S. PATENT DOCUMENTS

| 4,685,150 | A | 8/1987 | Maier | |
|---|---|---|---|---|
| 6,175,274 | B1 * | 1/2001 | Groe | 330/51 |
| 6,307,442 | B1 * | 10/2001 | Meyer et al. | 333/17.1 |
| 6,525,609 | B1 * | 2/2003 | Behzad | 330/254 |
| 6,686,809 | B2 * | 2/2004 | Nystrom et al. | 333/17.1 |
| 6,731,175 | B1 * | 5/2004 | Chen | 330/311 |
| 6,750,734 | B2 * | 6/2004 | Utsunomiya et al. | 333/17.1 |
| 6,778,023 | B2 * | 8/2004 | Christensen | 331/16 |
| 6,823,292 | B2 * | 11/2004 | Spencer | 702/190 |
| 6,954,115 | B2 * | 10/2005 | Wong | 333/17.1 |
| 6,965,275 | B2 * | 11/2005 | Di Giandomenico et al. | 333/17.1 |
| 7,002,427 | B2 * | 2/2006 | Nystrom et al. | 333/17.1 |
| 7,076,225 | B2 * | 7/2006 | Li et al. | 455/245.1 |
| 7,183,880 | B2 * | 2/2007 | Kamata et al. | 333/174 |
| 7,323,945 | B2 * | 1/2008 | Cyr et al. | 331/16 |
| 7,346,324 | B2 * | 3/2008 | Sakurai | 455/285 |
| 2004/0212447 | A1 | 10/2004 | Nystrom et al. | |
| 2005/0012565 | A1 * | 1/2005 | Kamata et al. | 333/174 |

FOREIGN PATENT DOCUMENTS

| DE | 4329705 | 3/1995 |
|---|---|---|
| DE | 19904604 | 6/2000 |

OTHER PUBLICATIONS

Frederik Emmons Terman, "Radio Engineering", 1947, p. 39-p. 52, McGraw-Hill Book Company, Inc, New York and London.

* cited by examiner

*Primary Examiner* — Christian Hannon
(74) *Attorney, Agent, or Firm* — Bruce Greenhaus

(57) ABSTRACT

A tuner uses a bank of tracking filters to preselect a channel to be received. Each tracking filter covers a range of frequencies. The tracking filters are tunable in frequency using switched capacitors and are tunable in gain by using switched resistors. The switched resistors can be controlled by an automatic gain control circuit that monitors the selected signal and adjust the tracking filter gain to achieve a desired signal level. A switch directs the received signal or signal from a test tone generator into the tracking filters. The test tone, generated by a frequency agile circuit, can be used to calibrate the filters, both in frequency and gain.

10 Claims, 3 Drawing Sheets

TRACKING FILTER FOR TUNER

RELATED APPLICATIONS

This application claims priority from U.S. provisional application No. 60/636,556 filed Dec. 16, 2004 entitled "Low Noise Amplifier and Tracking filter for tune", incorporated herein by reference.

BACKGROUND

1. Field of the Invention

The present invention relates to filters used with radio frequency tuners and specifically to tunable tracking filters.

2. Prior Art

Broadband receivers such as TV and cable tuners that are built with discrete components often incorporate tracking filters that operate on the radio frequency (RF) input signal prior to conversion from RF to intermediate frequency (IF) or baseband. The filters are tune-able such that they can be set to have their center frequencies at the desired channel. This has several benefits:

1. Superior distortion performance: Jammers are attenuated before they reach subsequent circuitry.

2. Image rejection: The subsequent mixer down converts two signals to the same IF frequency, the desired channel as well as the undesired image channel at a frequency above or below the desired channel frequency. If 'IF' denotes the IF frequency, 'CH' denotes the desired channel frequency, and 'IM' denotes the image channel frequency, then IF=CH−LO but also IF=LO−IM. Thus both CH and IM convert to the same IF output frequency, resulting in possible corruption of the desired channel output. The tracking filter can be used to help suppress the image channel.

3. Harmonic suppression: In addition to LO-RF, the subsequent mixer also to some extent down-converts signal at the harmonics of the LO, i.e. 2LO-RF, 3LO-RF, etc. The filtering suppresses signals that might reside at multiples of the LO and thereby helps in preventing contamination of the down-converted desired channel.

Prior art techniques implement RF tracking filters with discrete components. In discrete circuits, the tracking filters are built using very low loss, high Q, passive components as well as varactors, which usually achieve the necessary linearity by utilizing a very high tuning voltage. With this method, very sharp low loss filtering can be achieved. This type of component choice is normally not available in integrated circuit technologies and therefore the circuit techniques are not applicable to these types of receivers implemented in integrated circuit technology.

Christensen, U.S. Pat. No. 6,778,023 entitled "Tunable filter and method of tuning a filter", issued Aug. 17, 2004, incorporated herein by reference, discloses a bandpass filter tuned by converting the filter in an oscillator and tuning the oscillator frequency using conventional tuning techniques such as tuning a varactor and measuring the oscillator frequency.

Birleson, U.S. Pat. No. 6,714,776 entitled "System and method for an image rejecting single conversion tuner with phase error correction" issued Mar. 30, 2004, incorporated herein by reference, discloses a single conversion tuner with tuned bandpass and image reject notch tracking filters to reject out of band and image signals.

Vorenkamp et al., U.S. Pat. No. 6,285,865 entitled "System and method for on-chip filter tuning", issued Sep. 4, 2001, incorporated herein by reference, discloses various aspects of one approach to a tunable LC filter using a dummy circuit and an active circuit. Vorenkamp examines phase transition at the center of the filter band to tune the filter.

Spencer, U.S. Pat. No. 6,823,292 entitled "unable Filter", issued Nov. 23, 2004, incorporated herein by reference, discloses a tunable filter for a single chip radio receiver. A bank of switchable passive capacitors connect in parallel to an inductor and a varactor to tune the center frequency of filter.

SUMMARY OF INVENTION

The present invention is an implementation of an RF tracking filter that can be created in integrated circuit technology. The tracking filter is tuned using switched-in capacitors in conjunction with a fixed inductor, which can be on-chip or off-chip. Optional switched-in resistors loading the filter provide adjustment for gain and Q of the filter. The filters can be driven by an active low gain buffer stage and passive voltage gain is achieved in the filter from the Q of the LC tank circuit. A low gain active stage provides high linearity compared to a high gain active stage. The advantages of the tunable filter are superior performance in the presence of jammers, image rejection, and harmonic suppression. The tunable filter includes selectable resistors to adjust the Q of the filter and provide an automatic gain control (AGC) function. The invention includes a method of circuit calibration for gain and frequency, wherein a test tone is selectively injected into the tracking filters and filter center frequency and gain response can be calibrated. The level of the test tone is limited to insure minimal emissions of the test tone. One or more tracking filters can be used in a tuner, with each tracking filter covering part of the frequency range of the tuner operation. The tracking filters preferably have some overlap in frequency range. The tracking filter can be used in conjunction with a low noise amplifier (LNA).

DETAILED DESCRIPTION OF THE INVENTION

Figure 1:
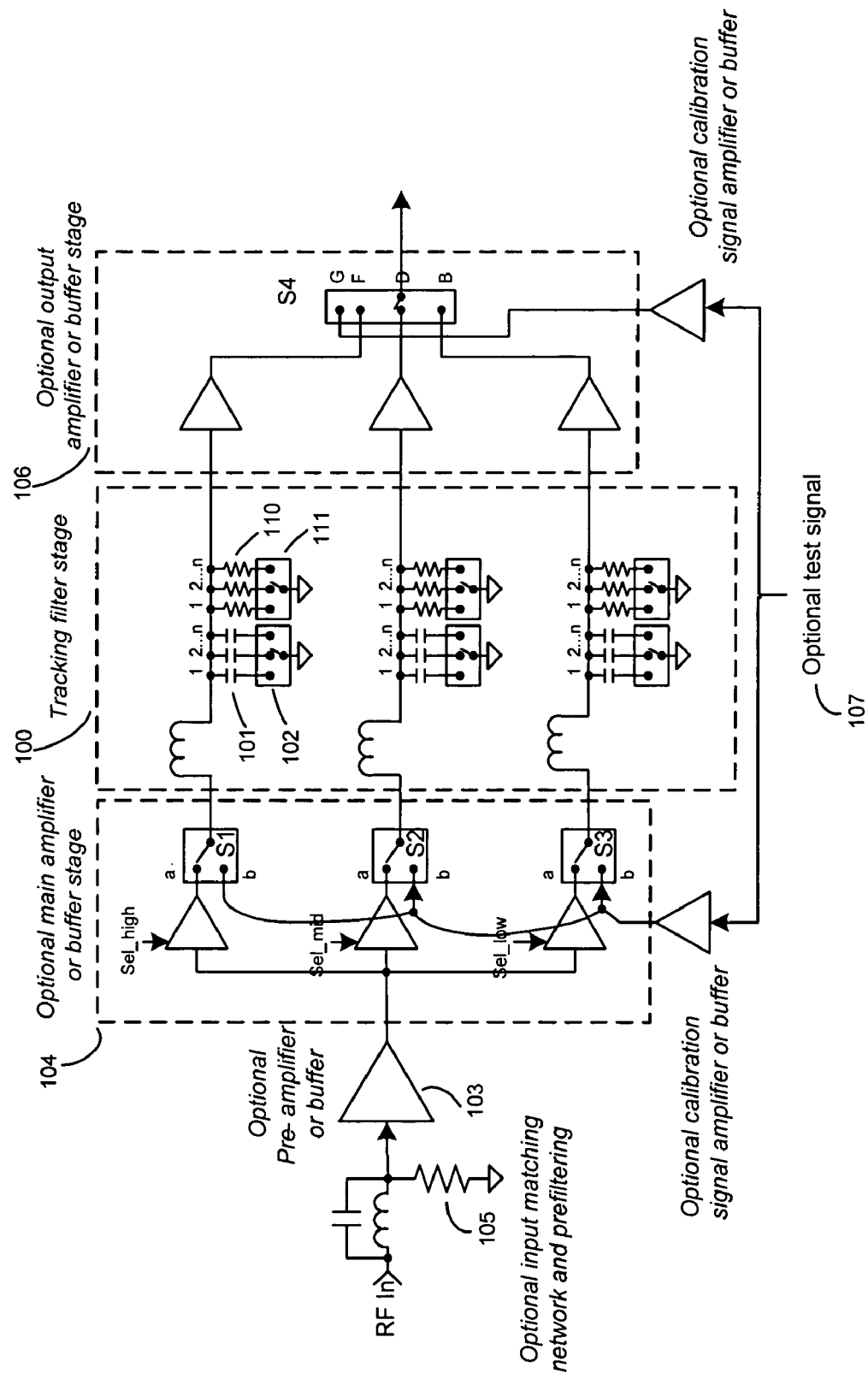
FIG. 1 shows a tracking filter block diagram according to the present invention.

FIG. 1 shows that tracking filter 100 relies on inductor and capacitor (LC) filtering using fixed inductors and variable capacitors. As shown, in one possible implementation, the variable capacitors are implemented as arrays of capacitors 101 with switches 102. The switches can easily be implemented using metal-oxide-semiconductor (MOS) transistors but other methods are possible too such as diode switches. The switches connect the capacitors to a common signal point, for example AC ground. The switches are shown on the AC ground side of the capacitors but could also be on the signal side of the capacitors. Additionally, FIG. 1 shows how low noise amplifier (LNA) 104 can be split up into several banks using different values of inductors to limit the required range of each capacitor bank. The variable capacitors can be implemented in other well-known ways such as with varactors or a combination of varactors with switched capacitors.

One implementation of the LNA is to use active gain elements. Another implementation of FIG. 1 can use unity gain or low gain buffers, for example, emitter followers, and gain is provided by the tracking filter. The tracking filter gain is the passive voltage multiplication provided by the Q of the LC tanks; therefore, the voltage gain would be equal to Q, the circuit's quality factor. A circuit's Q is defined as two times the product of pi and the ratio of the maximum energy stored to the energy dissipated per cycle. In addition to the gain from the Q, the LNA/tracking filter can also provide voltage gain at its input due to intentionally mismatching, for example, the input impedance is set higher than the signal source impedance, which causes less voltage division from the source than if the input impedance had been power-matched. This effect is maximized if high input impedance buffers are used; however, if there is a restriction on allowable S11 (input reflection coefficient) then it may be necessary to set the input impedance to a lower value. This can be done by either using amplifier or buffer 103 with a suitable input impedance or by using resistor 105 as shown in FIG. 1. Alternatively, an impedance matching technique can be used that is described in co-pending and commonly assigned U.S. patent application filed Dec. 9, 2005, serial number TBD, entitled "Tuner Design and System For Lossless Interconnect Of Multiple Tuner" by Peter Shah, which claims priority from U.S. provisional application No. 60/636,305 filed Dec. 15, 2004 entitled "Tuner Design and System For Lossless Interconnect Of Multiple Tuners" incorporated herein by reference. In this technique, a switchable matching impedance can be integrated into the tuner or can be located outside the tuner.

Using emitter followers in the LNA as opposed to active gain blocks enables very high linearity and high input impedance. It is especially an advantage that the load impedance for the emitter followers increases significantly for frequencies away from the resonance frequency of the LC circuit. This greatly improves linearity for jammers at larger frequency offsets from the desired channel without sacrificing noise figure for the desired signal.

FIG. 1 shows the LNA consisting of pre-buffer or amplifier 103 driving three buffers or amplifiers, of which only one is active at a time, depending on which band is selected. The number of bands could be any number from 1 upwards. In addition, the pre-buffer can be omitted-its main benefit is to reduce parasitic loading of the RF input from the disabled tracking filter buffers. Similarly the switches (S1, S2, S3) can be omitted if the test signal buffer is designed so that it has relatively high output impedance when off. The same argument applies to switch S4 in stage 106 of FIG. 1. The mentioned buffers do not have to be emitter-followers; they could be implemented as source followers or as any other known buffer technique.

In one embodiment, variable automatic gain control (AGC) gain can be obtained by using variable parallel resistors across the tank circuits, which can de-Q the filter and thereby lower the gain. In one implementation, the variability can be achieved by a resistor network 110 with switches 111 connecting the resistors to ground. This should be construed as AC ground, for example a suitable reference voltage or a capacitor connected to the circuit ground or any other technique for providing an AC signal ground. Alternatively, the switches could be placed between the resistors and the signal node. Variability of the resistors can be achieved in other well know ways, including using MOS transistors.

The LNA optionally incorporates calibration signal input 107. This can be used for auto-calibration of the center frequency that, for example, would determine the correct capacitor switch settings. The test signal can either be passed through the LNA or it can be routed directly to the output. The latter feature also enables gain calibration if desired.

LNA and Tracking Filter Calibration

Figure 2:
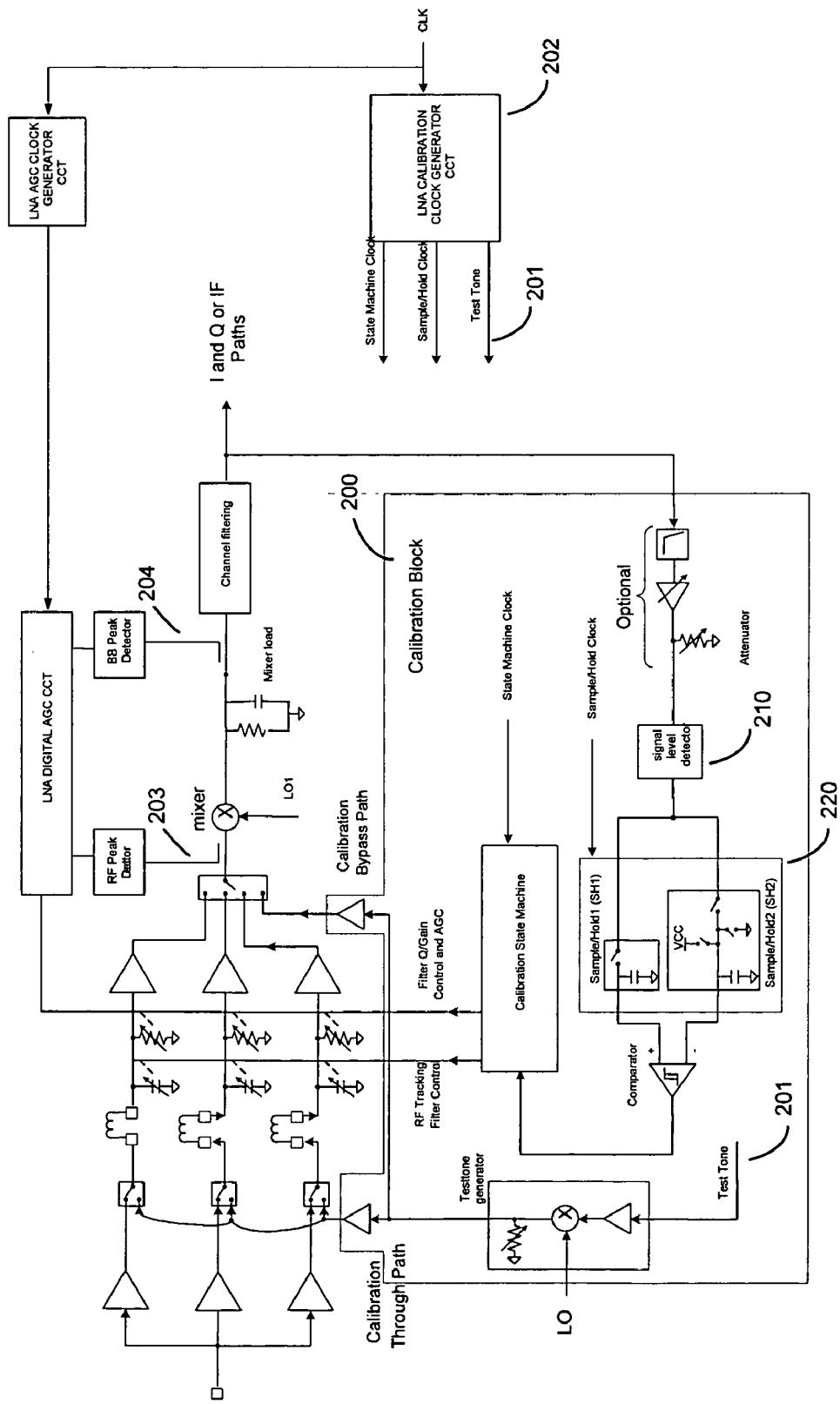
FIG. 2 shows an LNA Calibration/AGC block diagram according to the present invention.

FIG. 2 shows LNA calibration circuitry comprising calibration block 200 and calibration clock generator circuit 202.

The purpose of the calibration circuit is twofold: to tune the filter to the desired channel by adjustment of the capacitor arrays, and to optionally adjust the gain. The gain can be adjusted at several locations, for example, in the LNA, before the LNA or, by adjusting the tank circuit Q and therefore the filter gain to a nominal value. Calibration clock generator circuit 202 produces calibration test tone 201 and clock signals for the sample/hold and state machine circuits.

The filter calibration is done by injection of test tone 201 in the signal path and by adjustment of the capacitor array while detecting the level of the test tone after it has passed through the receiver and dedicated detection circuitry 210. The filter is centered by detecting the point at which, as the capacitor array is adjusted, the receive path gain is maximized. One way of achieving this is to monotonically adjust the capacitor array until the gain stops increasing and starts to decrease. Hence, the circuit yields the peak receive path gain that is also for this filter topology the center frequency of the filter. This method requires some storage mechanism in order to determine change in gain from one step to the next. This can be achieved in several well-known ways, including sample-hold circuits 220 for analog implementations or registers in digital implementations.

The gain calibration is done by injection of test tone 201 in the signal path, and establishing a reference receive path gain "A" with the LNA bypassed. The LNA is then switched in using the calibration through path and a new receive gain path gain "B" is established. The difference between "A" and "B" is the gain of the LNA and tracking filter. The filter gain is then optimized by adjustment of a resistor array. In one implementation, an attenuator loss of predetermined value is switched in into the calibration block during the "B" phase only. The filter gain is optimized by adjustment of a resistor array while detecting the level of the test tone, after passing through the receiver and dedicated detection circuitry. Path gain "B" is compared with the previously established reference receive path gain "A". The filter gain is optimized and equal to the predetermined attenuator loss when gains "A" and "B" are equal, since the LNA gain exactly offsets the attenuator loss. Hence, the LNA gain can be precisely set and in addition, if several attenuator values are available then several LNA gain settings can be achieved. Similar to the filter calibration, a storage function is needed. For the gain calibration, the signals representing gain "B" and the previously determined gain "A" need to be stored and compared.

The LNA calibration of determining center frequency and gain can be implemented in several ways, spanning from complete analog to complete digital or software implementation. FIG. 2 shows a mainly analog implementation in which the aforementioned storage function is implemented with sample-hold circuits. Alternatively, in a digital implementation one could use registers to store previously digitized signal samples. In digital receivers, such digitization of signal samples is already present and can be taken advantage of for this calibration as well.

This invention also addresses some potential issues with the calibration method. Situations to consider include leakage of the test tone out the RF pins could violate emissions specifications, noise and strong co-channel interference at the input can corrupt the calibration, thus making reliable signal level measurements difficult, and off-channel jammers can corrupt calibration by overwhelming the test tone signal and thereby causing the calibration machine to center on the jammer instead of the test tone.

To overcome these issues, a test tone level control circuit can optionally be implemented which minimizes the level of the test tone while ensuring that noise or interference does not corrupt the measurement. For this the test tone level is set to a minimal value and gradually increased until a minimum required ratio of calibration test tone to noise and interference is achieved. This also ensures that emission of test tone power is minimized during the calibration period.

Figure 3:
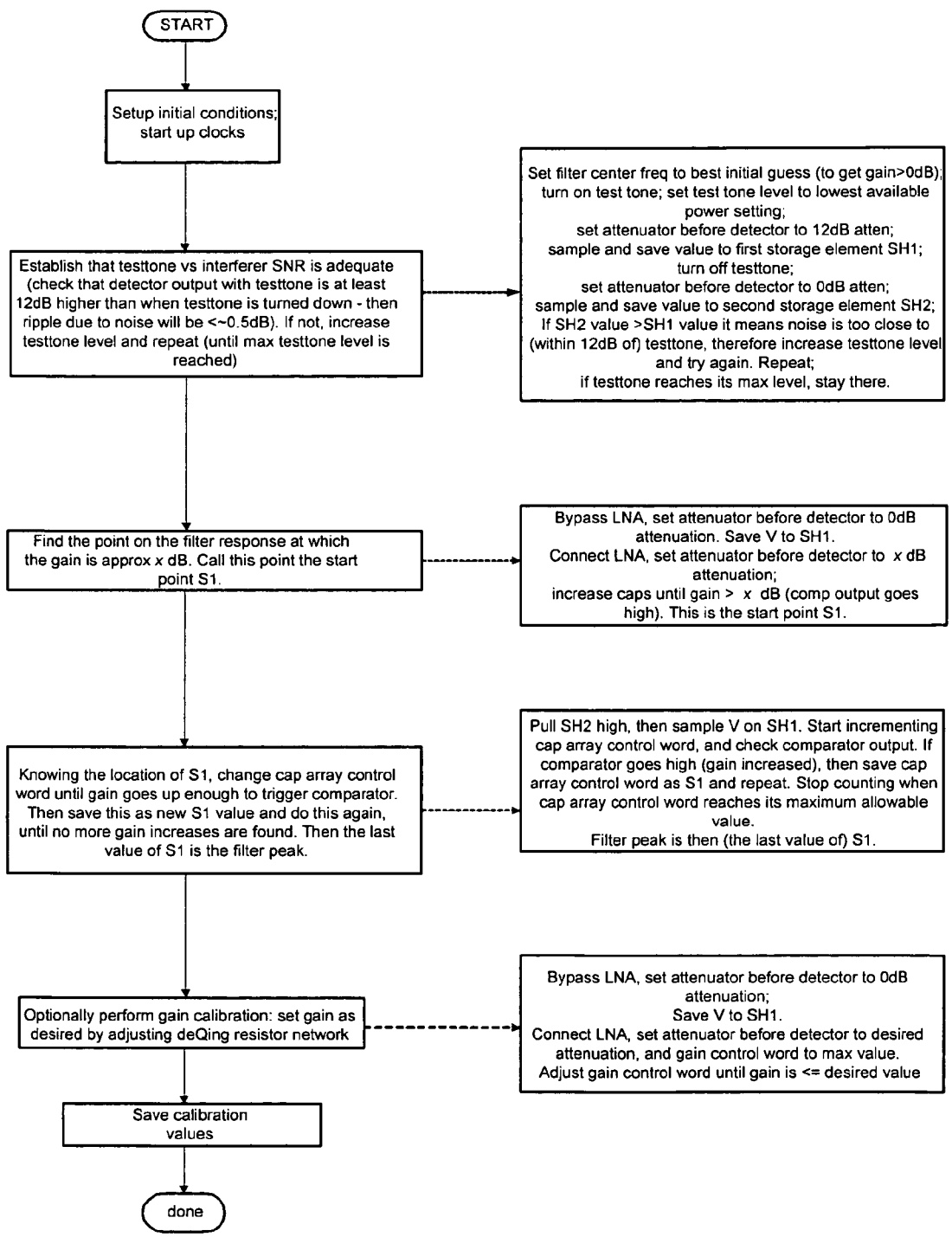
FIG. 3 shows an example of a calibration procedure according to the present invention.

FIG. 3 shows details of an example of the described calibration procedure. The calibration procedure can be implemented in various other ways.

AGC Control Loop

FIG. 2 shows an example implementation of an AGC loop around the LNA/tracking filter. This can take any number of inputs from any locations in the signal path. In the example shown, two sense points are used, input 203 of the mixer and input 204 of the main part of the channel filter. Using this method, the front-end gain is determined by avoidance of overloading the channel filter as well as avoidance of overloading the mixer input. It is advantageous to use a sense point after the tracking filter but before the mixer. This enables the AGC to react to off-channel jammers. The jammer level at which the AGC starts reducing the gain then depends on the frequency offset from the desired channel; the further the frequency offset is, the higher the tolerable jammer level before the onset of gain reduction. This is desirable because the distortion properties improve with further offset as well, thus allowing higher jammer levels for increasing frequency offset without contaminating the desired channel unacceptably. This allows the receiver to operate at higher gain for the desired channel compared to if the sense point had been before the tracking filter. The higher gain, in turn, means lower noise figure in the presence of jammers and therefore better reception quality.

In the implementation shown in FIG. 2, the AGC loop can advantageously be implemented in digital form, for example as an up/down counter whose output word controls the resistor array. The counter would be clocked with a reference frequency and the up/down control would be determined by the outputs of the power or peak detection circuits. In a simple form the analog outputs can be compared to reference, called "set point" values by using comparators and the digital outputs of these comparators can then be logically OR'ed together to form the up/down control signal for the counter. In situations where the jammers are analog video signals asymmetric AGC attack and decay times can be used, one implementation would be to sample a number of consecutive samples of the error signal to detect a ramp up/down and use this to slow down the counter clock using a divider.

Maximum Filter Q

It may be desirable to limit the maximum Q of the filter to prevent excessive gain variation in the passband, for example, lower frequencies will yield a narrower passband than at higher frequencies for the same Q value. A maximum filter Q can be set by limiting the maximum value of the variable resistors. One way to implement a resistance limit with switched resistors is to have a separate control register to store the limit value; the value may be different based on frequency. The resistor control word is then prevented from setting the resistance beyond the limit value.

What is claimed is:

1. A tracking filter for a tuner comprising:
   a first input buffer having an emitter follower circuit with an output and an input, the input connected to receive signals to be filtered and the input buffer having a load impedance that increases significantly for frequencies away from the resonance frequency;
   an inductor with a first and second terminal, the first terminal connected to the output of the first input buffer;
   a variable capacitor connected between the inductor second terminal and a common signal point, wherein the variable capacitor is varied to adjust the center frequency of the tracking filter; and
   a variable resistor connected in parallel to the variable capacitor, wherein the variable resistor is adjusted to adjust the gain of the tracking filter.

2. The tracking filter of claim 1 wherein the variable capacitor comprises a plurality of capacitors and a plurality of switches, each capacitor connected in series with a switch.

3. The tracking filter of claim 1 wherein the variable resistor comprises a plurality of resistors and a plurality of switches, each resistor connected in series with a switch.

4. The tracking filter of claim 1 wherein the variable resistor adjusts the quality factor (Q) of the filter.

5. The tracking filter of claim 1 further comprising a second input buffer connected to the input of the first input buffer to set the input impedance of the tracking filter to a lower value.

6. The tracking filter of claim 1 wherein the filter impedance is mismatched to the signal source impedance.

7. A tuner comprising:
   a plurality of tracking filters, at least one such tracking filter comprising:
      a first input buffer having an emitter follower with an output and an input, the input connected to receive signals to be filtered and the input buffer having a load impedance that increases significantly for frequencies away from the resonance frequency;
      an inductor-capacitor-resistor filter, wherein the capacitance is variable and the resistance is variable, the inductor being coupled to the output of the first input buffer; and
      a switch to selectively apply a test tone to the input of the tracking filter;
   wherein the capacitance is programmed to control the frequency of the filter and the resistance is programmed to control the gain of the filter and the test tone is be used to calibrate the filter.

8. The tuner of claim 7 wherein the test tone level is controlled to minimize test tone emission using a circuit to find a minimal adequate test tone to noise and interference ratio.

9. The tracking filter of claim 1, wherein the first input buffer is a source follower circuit.

10. The tracking filter of claim 1, further including an automatic gain control loop comprising at least one sense point located on the second terminal side of the inductor to allow the automatic gain control loop to react to off-channel jammers.

* * * * *